(12) United States Patent
Chen et al.

(10) Patent No.: US 10,283,377 B1
(45) Date of Patent: May 7, 2019

(54) INTEGRATED FAN-OUT PACKAGE AND MANUFACTURING METHOD THEREOF

(71) Applicant: Taiwan Semiconductor Manufacturing Co., Ltd., Hsinchu (TW)

(72) Inventors: Meng-Tse Chen, Pingtung County (TW); Ching-Hua Hsieh, Hsinchu (TW); Chung-Shi Liu, Hsinchu (TW); Chih-Wei Lin, Hsinchu County (TW); Sheng-Hsiang Chiu, Tainan (TW); Yao-Tong Lai, Yilan County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/832,742

(22) Filed: Dec. 5, 2017

Related U.S. Application Data

(60) Provisional application No. 62/582,333, filed on Nov. 7, 2017.

(51) Int. Cl.
*H01L 21/56* (2006.01)
*H01L 23/31* (2006.01)
*H01L 23/00* (2006.01)

(52) U.S. Cl.
CPC .......... *H01L 21/563* (2013.01); *H01L 21/561* (2013.01); *H01L 21/568* (2013.01); *H01L 23/3135* (2013.01); *H01L 24/05* (2013.01); *H01L 24/08* (2013.01); *H01L 24/13* (2013.01); *H01L 24/14* (2013.01); *H01L 24/97* (2013.01); *H01L 2224/02319* (2013.01); *H01L 2224/02331* (2013.01); *H01L 2224/02379* (2013.01); *H01L 2224/02381* (2013.01); *H01L 2224/0401* (2013.01); *H01L 2224/04105* (2013.01); *H01L 2224/05548* (2013.01);
(Continued)

(58) Field of Classification Search
CPC ... H01L 24/14; H01L 23/3135; H01L 21/568; H01L 2224/13024; H01L 2224/13008; H01L 2224/02331; H01L 2224/02379
See application file for complete search history.

(56) References Cited

U.S. PATENT DOCUMENTS 8,975,741 B2 * 3/2015 Lin ..................... H01L 21/568
257/700
9,000,584 B2 4/2015 Lin et al.
(Continued)

*Primary Examiner* — Syed I Gheyas
(74) *Attorney, Agent, or Firm* — JCIPRNET

(57) ABSTRACT

An integrated fan-out (InFO) package includes at least one die, a plurality of conductive structures, an encapsulant, an enhancement layer, and a redistribution structure. The die has an active surface and includes a plurality of conductive posts on the active surface. The conductive structures surround the die. The encapsulant partially encapsulates the die. The enhancement layer is over the encapsulant. A top surface of the enhancement layer is substantially coplanar with top surfaces of the conductive posts and the conductive structures. A material of the enhancement layer is different from a material of the encapsulant. A roughness of an interface between the encapsulant and the enhancement layer is larger than a roughness of the top surface of the enhancement layer. The redistribution structure is over the enhancement layer and is electrically connected to the conductive structures and the die.

13 Claims, 20 Drawing Sheets

(52) U.S. Cl.
CPC ............ *H01L 2224/08265* (2013.01); *H01L 2224/13008* (2013.01); *H01L 2224/13024* (2013.01); *H01L 2224/1403* (2013.01); *H01L 2224/14051* (2013.01); *H01L 2224/14181* (2013.01); *H01L 2224/95001* (2013.01); *H01L 2924/19103* (2013.01)

(56) References Cited

U.S. PATENT DOCUMENTS

| | | | |
|---|---|---|---|
| 9,048,222 B2 | 6/2015 | Hung et al. | |
| 9,048,233 B2 | 6/2015 | Wu et al. | |
| 9,064,874 B2 | 6/2015 | Edelstein et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,443,797 B2 * | 9/2016 | Marimuthu | H01L 23/49805 |
| 9,496,189 B2 | 11/2016 | Yu et al. | |
| 2013/0062761 A1 * | 3/2013 | Lin | H01L 23/49816 257/738 |
| 2014/0038353 A1 * | 2/2014 | Kim | H01L 24/96 438/107 |
| 2014/0203429 A1 * | 7/2014 | Yu | H01L 21/78 257/737 |
| 2014/0252646 A1 * | 9/2014 | Hung | H01L 23/481 257/774 |

\* cited by examiner

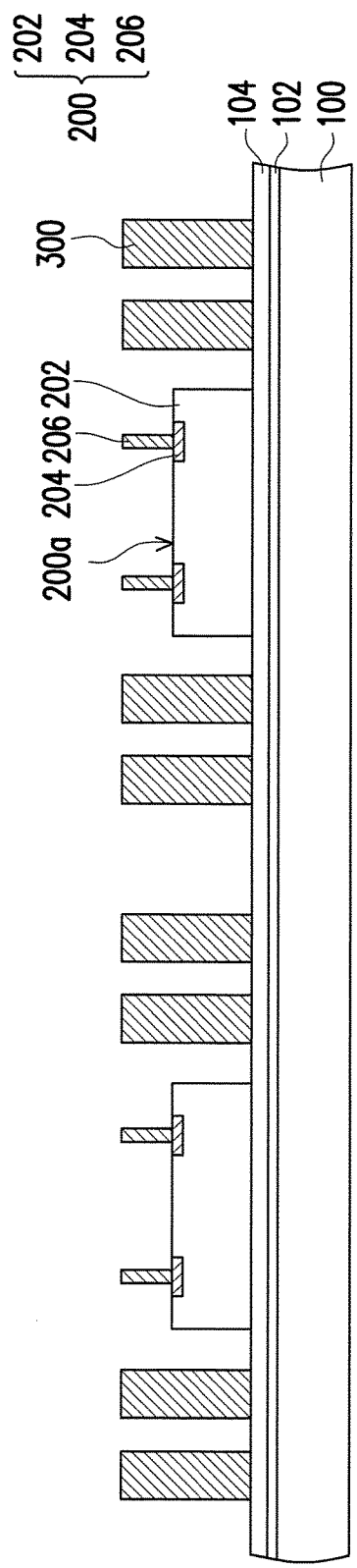
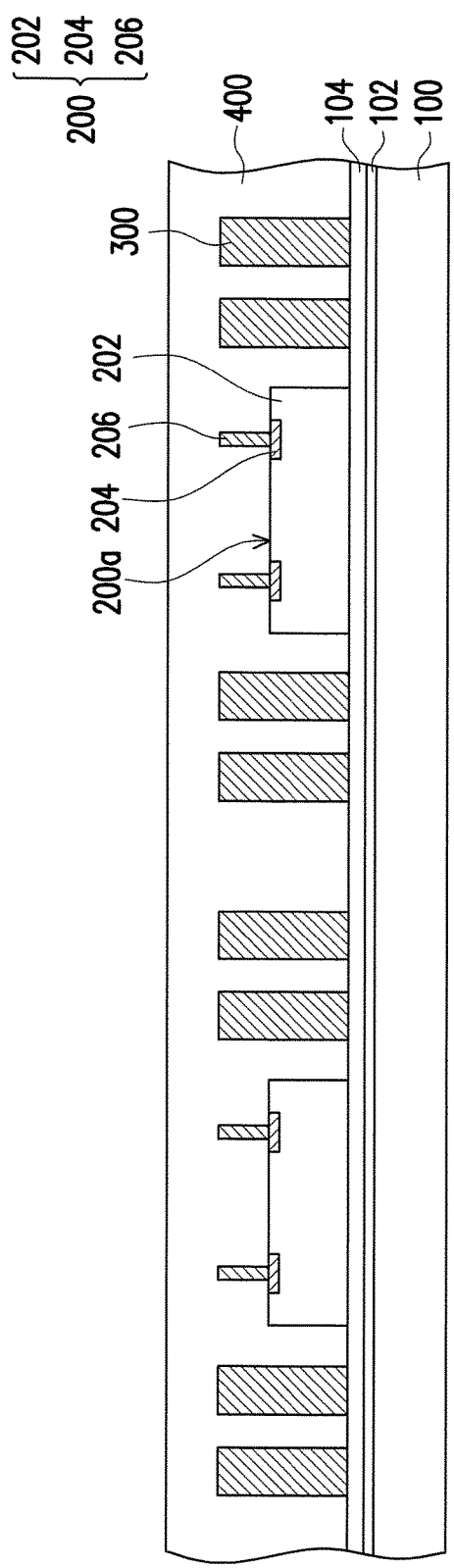

INTEGRATED FAN-OUT PACKAGE AND MANUFACTURING METHOD THEREOF

CROSS-REFERENCE TO RELATED APPLICATION

This application claims the priority benefit of U.S. provisional application Ser. No. 62/582,333, filed on Nov. 7, 2017. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Currently, integrated fan-out packages are becoming increasingly popular for their compactness. The integrated fan-out packages typically include a redistribution circuit structure laying over the molded integrated circuit devices such that the integrated circuit devices may be accessed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 1L are schematic cross-sectional views illustrating a manufacturing process of an integrated fan-out (InFO) package in accordance with some embodiments of the disclosure.

DETAILED DESCRIPTION

Figure 1C:
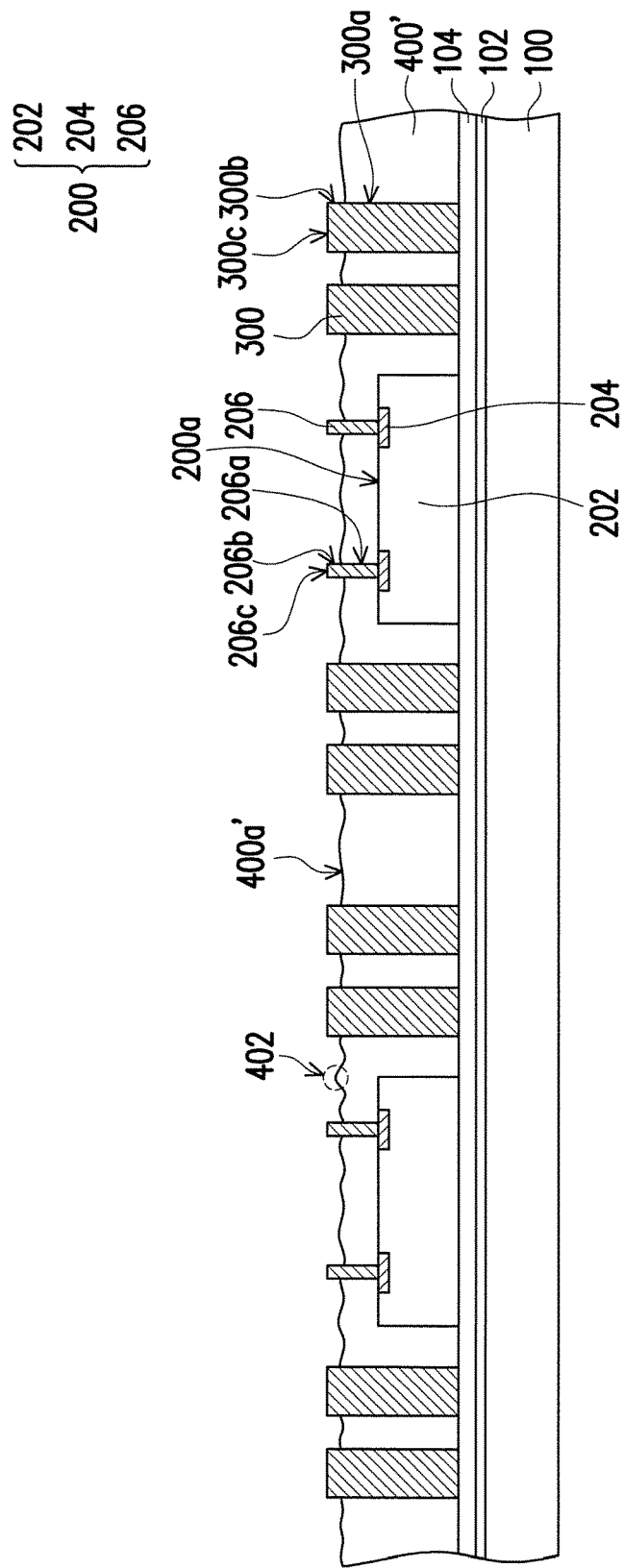

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1L are schematic cross-sectional views illustrating a manufacturing process of an integrated fan-out (InFO) package 10 in accordance with some embodiments of the disclosure. Referring to FIG. 1A, a carrier 100 is provided. A de-bonding layer 102 and a dielectric layer 104 are stacked over the carrier 100 in sequential order. In some embodiments, the de-bonding layer 102 is formed on the upper surface of the carrier 100 and the de-bonding layer 102 is between the carrier 100 and the dielectric layer 104. The carrier 100 is, for example, a glass substrate. However, the disclosure is not limited thereto. The carrier 100 may be made of any suitable material as long as such material is able to withstand the subsequent processes. In some embodiments, the de-bonding layer 102 is a light-to-heat-conversion (LTHC) release layer formed on the carrier 100. In some embodiments, the dielectric layer 104 may be formed of polymeric materials. Examples of the polymeric material include polyimide, benzocyclobutene (BCB), polybenzoxazole (PBO), or the like. In some alternative embodiments, the dielectric layer 104 may include non-organic dielectric materials such as silicon oxide, silicon nitride, silicon carbide, silicon oxynitride, or the like. However, the materials of the de-bonding layer 102 and the dielectric layer 104 are merely for illustration and the disclosure is not limited thereto.

A plurality of pre-fabricated conductive structures 300 and a plurality of pre-fabricated dies 200 are provided over the dielectric layer 104. For example, the dies 200 are mounted onto the dielectric layer 104 having the conductive structures 300 formed thereon. A die attach film (DAF) (not illustrated) is locate between the dies 200 and the dielectric layer 104 for adhering the dies 200 onto the dielectric layer 104. In some embodiments, the dies 200 are arranged in an array and are surrounded by the conductive structures 300.

In some embodiments, each die 200 includes a semiconductor substrate 202, a plurality of conductive pads 204, and a plurality of conductive posts 206. Each of the dies 200 has an active surface 200a opposite to the surface attaching to the dielectric layer 104. For example, as illustrated in FIG. 1A, the active surface 200a of the die 200 face upward. In some embodiments, the semiconductor substrate 202 may be made of silicon or germanium. However, the disclosure is not limited thereto. The semiconductor substrate 202 may also include other suitable semiconductor materials, such as elements in Group III, Group IV, and/or Group V in the periodic table. The conductive pads 204 are distributed on the active surface 200a of the die 200. In some embodiments, the conductive pads 204 are embedded in the semiconductor substrate 202 as illustrated in FIG. 1A. Nevertheless, it should be understood that the configuration depicted in FIG. 1A merely serves as an exemplary illustration, and the disclosure is not limited thereto. In some alternative embodiments, the conductive pads 204 may protrude from the active surface 200a of the die 200. The conductive posts 206 are disposed on the active surface 200a of the die 200. For example, the conductive posts 206 are disposed on the conductive pads 204 such that the conductive posts 206 are electrically connected to the conductive pads 204. The conductive posts 206 may be copper posts or other suitable metallic posts. Referring to FIG. 1A, the active surface 200a of the die 200 is exposed to atmospheric environment. In other words, the active surface 200a of the die 200 is not covered by a dielectric layer. As illustrated in FIG. 1A, top surfaces of the dies 200 (top surfaces of the conductive posts 206) are substantially coplanar with top surfaces of the conductive structures 300. However, the disclosure is not limited thereto. In some alternative embodiments, the top surfaces of the dies 200 may be lower than the top surfaces of the conductive structures 300.

In some embodiments, the conductive structures 300 may be conductive pillars. For example, the conductive structures 300 may be conductive pillars made of copper, copper alloys, or other metallic materials. In some embodiments, the conductive structures 300 may be referred to as through interlayer vias (TIVs). For example, the conductive structures 300 are through integrated fan-out (InFO) vias in some embodiments. It should be noted that although FIG. 1A depicted eight conductive structures 300, the number of conductive structures 300 is not limited thereto. In some alternative embodiments, the number of the conductive structures 300 may be fewer or more based on circuit design.

Referring to FIG. 1B, an encapsulant material 400 is formed on the dielectric layer 104 to encapsulate the conductive structures 300 and the dies 200. In some embodiments, the encapsulant material 400 is a molding compound formed by a molding process. For example, the encapsulant material 400 may include epoxy or other suitable materials. In some embodiments, the encapsulant material 400 includes fillers to enhance the mechanical strength thereof. As illustrated in FIG. 1B, the conductive structures 300 and the conductive posts 206 of the dies 200 are not revealed and are well protected by the encapsulant material 400.

Referring to FIG. 1C, a portion of the encapsulant material 400 is removed to form an encapsulant 400'. The portion of the encapsulant material 400 may be removed by an anisotropic etching process such that the conductive structures 300 and the conductive posts 206 of the dies 200 are partially exposed. In some embodiments, the portion of the encapsulant material 400 may be removed through a plasma etching process such that a portion of sidewalls of the conductive structures 300 and a portion of sidewalls of the conductive posts 206 are exposed. For example, as illustrated in FIG. 1C, a first portion of sidewalls 300a of the conductive structures 300 is covered by the encapsulant 400' while a second portion of sidewalls 300b of the conductive structures 300 is exposed by the encapsulant 400'. Similarly, a first portion of sidewalls 206a of the conductive posts 206 is covered by the encapsulant 400' while a second portion of sidewalls 206b of the conductive posts 206 is exposed by the encapsulant 400'. As illustrated in FIG. 1C, the top surface 400a' of the encapsulant 400' is lower than top surfaces 300c of the conductive structures 300 and top surfaces 206c of the conductive posts 206 and higher than active surfaces 200a of the dies 200. In some embodiments, during the plasma etching process, the etchant includes Argon (Ar) gas, nitrogen ($N_2$) gas, oxygen ($O_2$) gas, or a combination thereof. In some embodiments, the plasma etching process results in a plurality of microstructures 402 on the top surface 400a' of the encapsulant 400'. In other words, the top surface 400a' of the encapsulant 400' is a rough surface. In some embodiments, the microstructures 402 are randomly dispersed on the top surface 400a' of the encapsulant 400'.

Figure 1D:
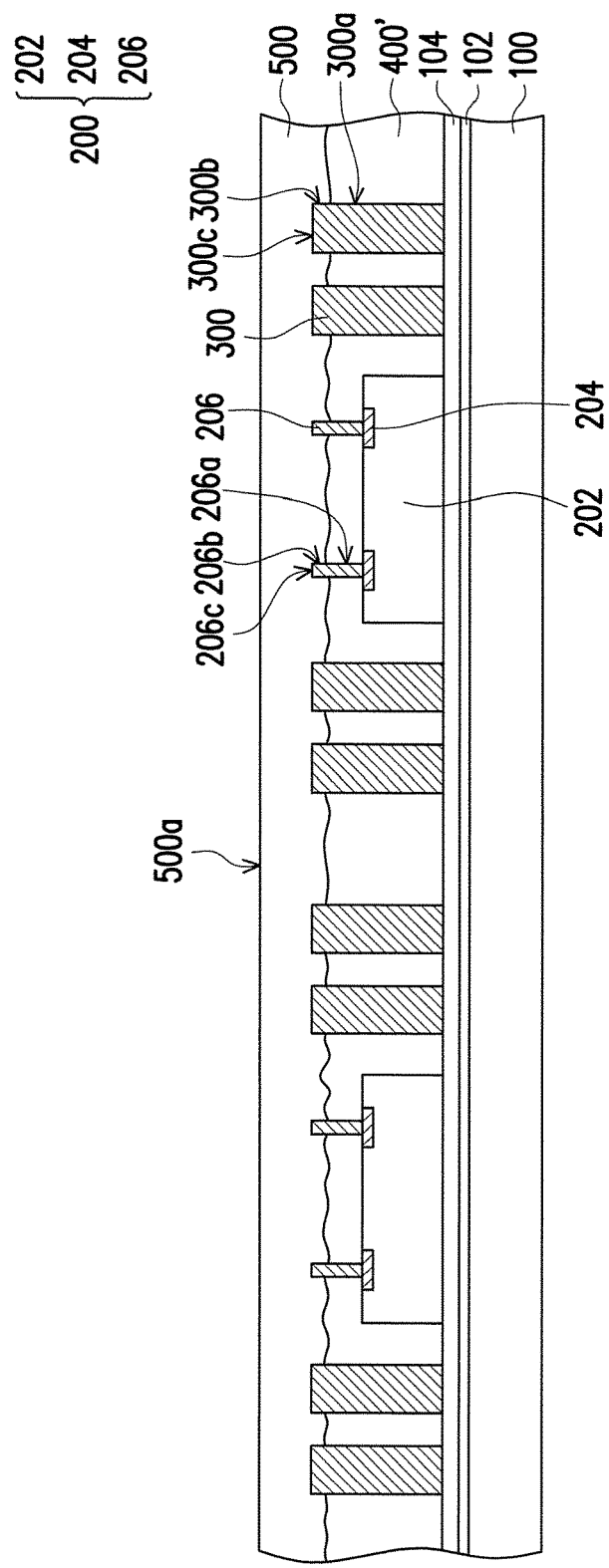

Referring to FIG. 1D, an enhancement material layer 500 is formed over the encapsulant 400' to cover the exposed portion of the conductive structures 300 and the exposed portion of the conductive posts 206. A material of the enhancement material layer 500 is different from the material of the encapsulant 400'. In some embodiments, the material of the enhancement material layer 500 includes dielectric material such as polyimide, epoxy resin, acrylic resin, phenol resin, BCB, PBO, or any other suitable polymer-based dielectric materials. Unlike the encapsulant 400', the enhancement material layer 500 is free of fillers. The enhancement material layer 500 is formed to completely seal the conductive structures 300 and the conductive posts 206. For example, as illustrated in FIG. 1D, top surface 500a of the enhancement material layer 500 is higher than top surfaces 300c of the conductive structures 300 and top surfaces 206c of the conductive posts 206.

Figure 1E:
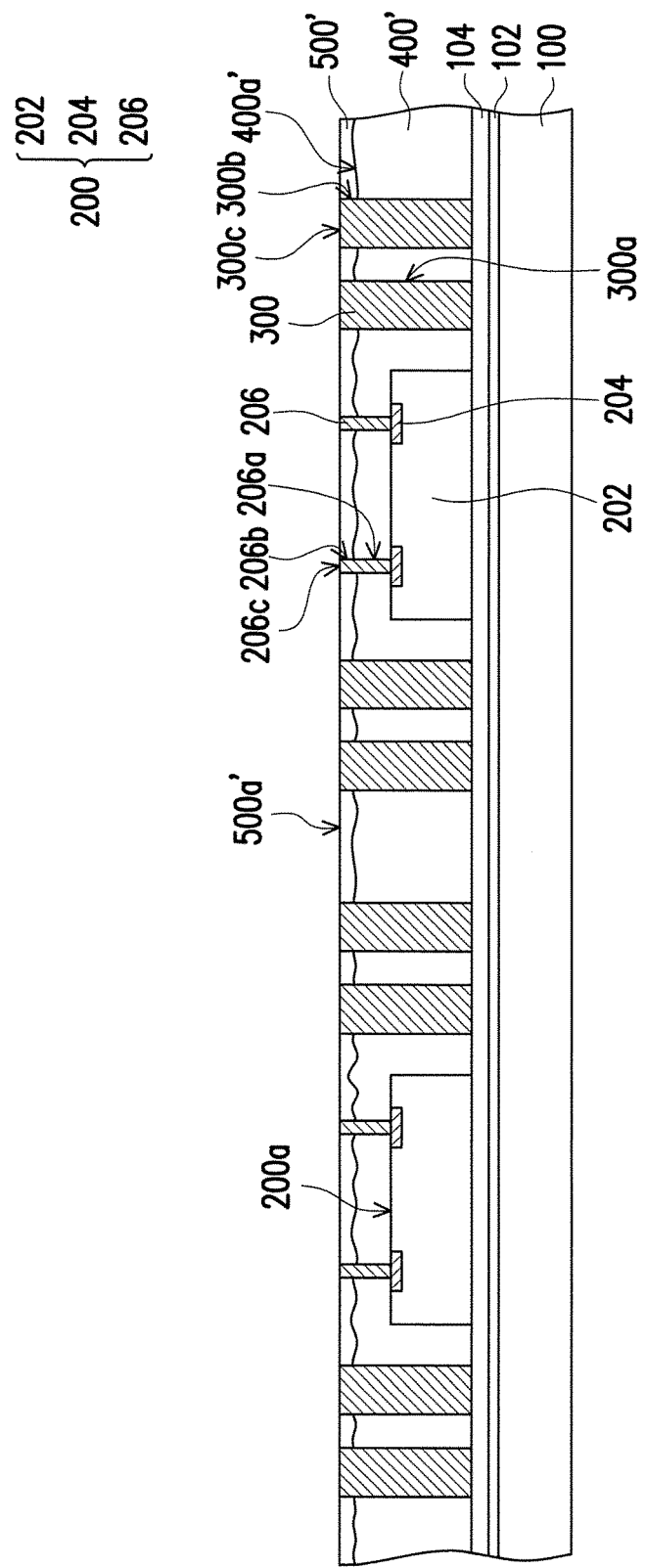

Referring to FIG. 1E, a portion of the enhancement material layer 500 is removed to form an enhancement layer 500'. The enhancement layer 500' exposes top surfaces 300c of the conductive structures 300 and top surfaces 206c of the conductive posts 206. In some embodiments, the portion of the enhancement material layer 500 may be removed through mechanical grinding, chemical mechanical polishing (CMP), fly cutting, or other suitable mechanisms. For example, the top surface 500a of the enhancement material layer 500 may be grinded until the top surfaces 300c of the conductive structures 300 and the top surfaces 206c of the conductive posts 206 are revealed. However, the disclosure is not limited thereto. In some alternative embodiments, after the top surfaces 300c of the conductive structures 300 and the top surfaces 206c of the conductive posts 206 are revealed, the enhancement material layer 500', the conductive structures 300, and the conductive posts 206 may be further grinded to reduce the overall thickness of the package. In some embodiments, top surface 500a' of the enhancement layer 500' is substantially coplanar with top surfaces 300c of the conductive structures 300 and top surfaces 206c of the conductive posts 206.

As illustrated in FIG. 1E, the enhancement layer 500' covers the second portion of sidewalls 300b of the conductive structures 300 and the second portion of sidewalls 206b of the conductive posts 206. In some embodiments, a ratio of a coverage of the first portion of sidewalls 206a of the conductive posts 206 by the encapsulant 400' to a coverage of second portion of sidewalls 206b of the conductive posts 206 by the enhancement layer 500' ranges between 50%: 50% and 80%:20%. For example, a height of the first portion of sidewalls 206a of the conductive posts 206 covered by the encapsulant 400' ranges between 5 µm and 20 µm, and a height of the second portion of sidewalls 206b of the conductive posts 206 by the enhancement layer 500' ranges between 2 µm and 10 µm. In some embodiments, the conductive posts 206 are uniform conductive posts with straight sidewalls. Therefore, the term "coverage" herein refers to an area of the lateral surface of the conductive posts 206 that is being covered. Since the enhancement layer 500' is formed over the encapsulant 400', the top surface 400a' of the encapsulant 400' may be referred to as an interface between the encapsulant 400' and the enhancement layer 500'.

In general, when a material having fillers is grinded, a plurality of pits is formed on the grinded surface due to removal of the fillers located on the grinded surface. However, as mentioned above, the enhancement material layer 500 is free of fillers. Therefore, upon processing the enhancement material layer 500, the resulting enhancement layer 500' has a smooth top surface 500a' with substantially no pit. In other words, a roughness of an interface (top surface 400a') between the encapsulant 400' and the enhancement layer 500' is larger than a roughness of the top surface 500a' of the enhancement layer 500. For example, the interface between the encapsulant 400' and the enhancement layer 500' has a roughness (Ra) ranges between 1 µm and 5 µm. On the other hand, the top surface 500a' of the enhancement layer 500' has a roughness ranges between 0.5 µm and 2 µm. The roughness of the interface between the encapsulant 400' and the enhancement layer 500' is able to enhance the adhesion between the encapsulant 400' and the enhancement layer 500', thereby improving the mechanical strength of the package.

Figure 1F:
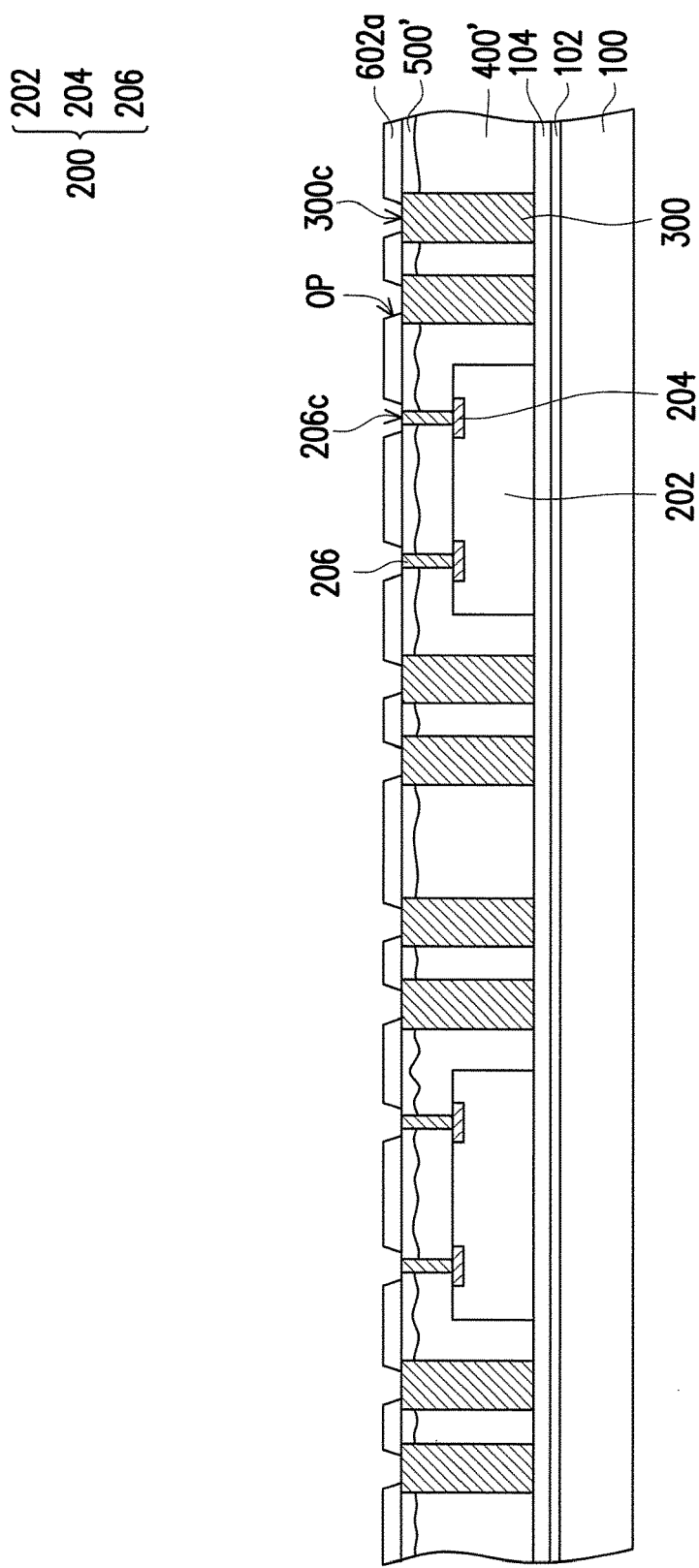
Figure 1G:
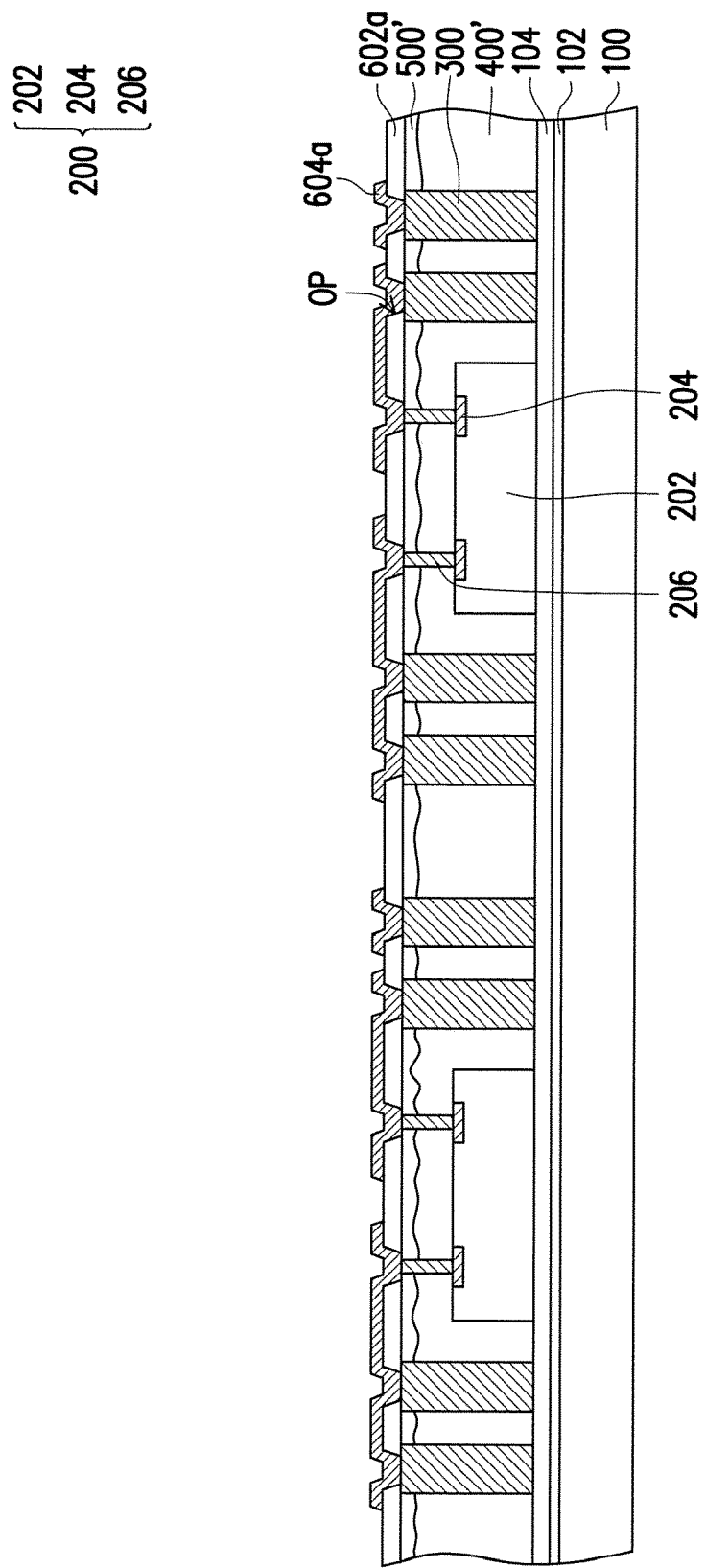
Figure 1H:
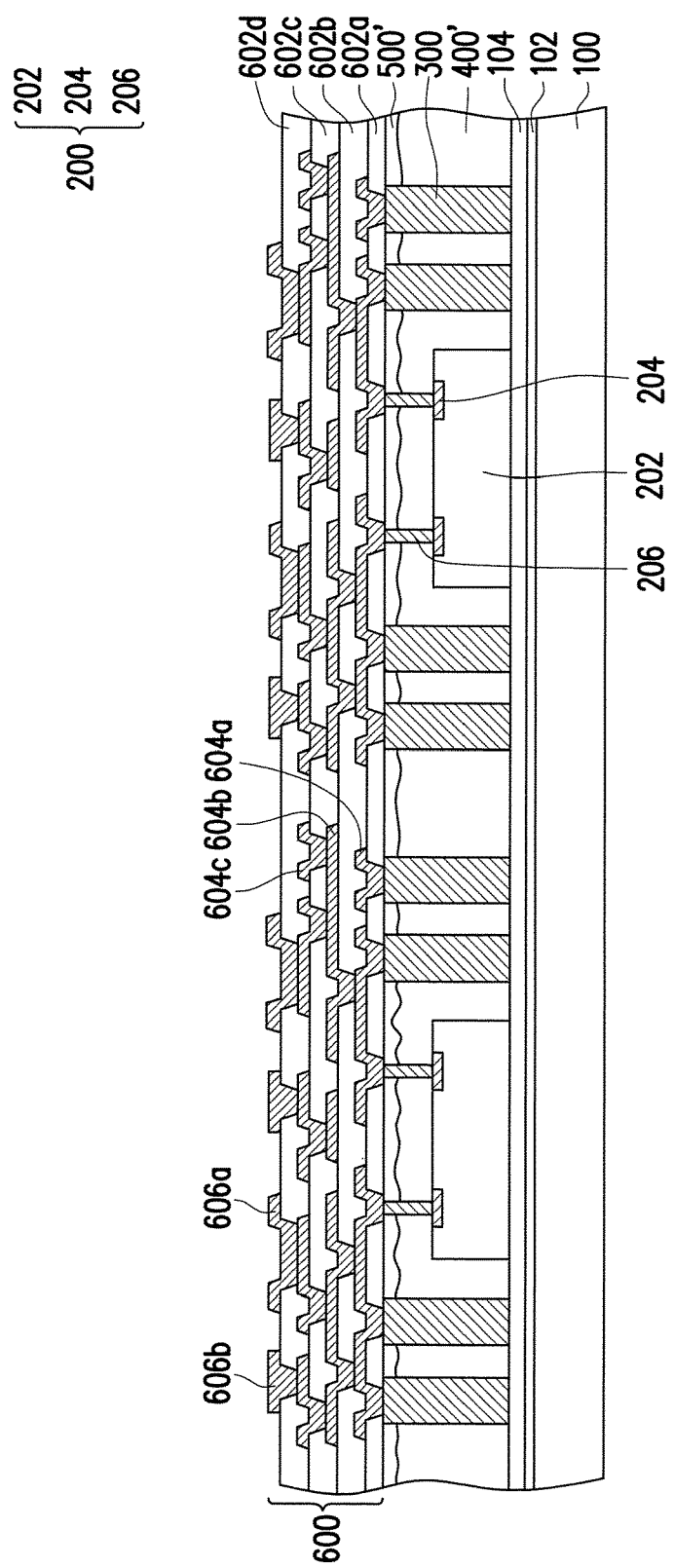

Referring to FIG. 1F to FIG. 1H, a redistribution structure 600 electrically connected to the conductive structures 300 and the conductive posts 206 is formed over the enhancement layer 500'. The steps for forming the redistribution structure 600 will be discussed in detail below.

Referring to FIG. 1F, a first dielectric layer 602a is formed over the enhancement layer 500', the conductive structures 300, and the conductive posts 206. The first dielectric layer 602a has a plurality of openings OP exposing the conductive structures 300 and the conductive posts 206 for future electrical connection. For example, the openings OP of the first dielectric layer 602a may be formed corresponding to the top surfaces 300c of the conductive structures 300 and the top surfaces 206c of the conductive posts 206. In some embodiments, the first dielectric layer 602a may be formed of polyimide, epoxy resin, acrylic resin, phenol resin, BCB, PBO, or any other suitable polymer-based dielectric materials.

Referring to FIG. 1G, a plurality of first redistribution conductive patterns 604a is formed over the first dielectric layer 602a and within the openings OP of the first dielectric layer 602a. The first redistribution conductive patterns 604a extends into the openings OP of the first dielectric layer 602a to be in direct contact with the conductive structures 300 and the conductive posts 206. In some embodiments, the first redistribution conductive patterns 604a may be formed by the following steps. First, a seed layer (not shown) is deposited onto the first dielectric layer 602a and within the openings OP of the first dielectric layer 602a. The seed layer may be formed by physical vapor deposition or other applicable methods. Subsequently, a mask layer (not shown) having a plurality of openings corresponding to the openings OP of the first dielectric layer 602a is formed over the seed layer. In other words, the openings of the mask layer exposes the seed layer located in the openings OP of the first dielectric layer 602a. Thereafter, a conductive material layer (not shown) is filled into the openings of the mask such that the conductive material layer is formed over the seed layer located in the openings of the mask. The conductive material layer may be formed by a plating process. The plating process is, for example, electro-plating, electroless-plating, immersion plating, or the like. Next, the mask and a portion of the seed layer not covered by the conductive material layer are removed. The conductive material layer and the remaining seed layer constitute the first redistribution conductive patterns 604a. In some embodiments, a material of the first redistribution conductive patterns 604a includes aluminum, titanium, copper, nickel, tungsten, and/or alloys thereof.

Referring to FIG. 1H, the steps similar to the steps illustrated in FIG. 1F to FIG. 1G may be repeated to form a second dielectric layer 602b, a third dielectric layer 602c, a fourth dielectric layer 602d, a plurality of second redistribution conductive patterns 604b, a plurality of third redistribution conductive patterns 604c, a plurality of under-ball metallurgy (UBM) patterns 606a, and a plurality of connection pads 606b. For example, the second dielectric layer 602b may be formed over the first dielectric layer 602a and the first redistribution conductive patterns 604a. Similar to the first dielectric layer 602a, the second dielectric layer 602b also has a plurality of openings exposing the first redistribution conductive patterns 604a. Subsequently, the second redistribution conductive patterns 604b is formed over the second dielectric layer 602b and extends into the openings of the second dielectric layer 602b to be in direct contact with the first redistribution conductive patterns 604a. The third dielectric layer 602c, the fourth dielectric layer 602d, the third redistribution conductive patterns 604c, the UBM patterns 606a, and the connection pads 606b may be formed by similar manners, so the detailed descriptions thereof are omitted herein.

As illustrated in FIG. 1H, the redistribution structure 600 includes a plurality of dielectric layers (the first dielectric layer 602a, the second dielectric layer 602b, the third dielectric layer 602c, and the fourth dielectric layer 602d) and a plurality of redistribution conductive patterns (the first redistribution conductive patterns 604a, the second redistribution conductive patterns 604b, the third redistribution conductive patterns 604c, the UBM patterns 606a, and the connection pads 606b) stacked alternately. The redistribution conductive patterns (the first redistribution conductive patterns 604a, the second redistribution conductive patterns 604b, the third redistribution conductive patterns 604c, the UBM patterns 606a, and the connection pads 606b) are electrically connected to the conductive structures 300 and the conductive posts 206 of the dies 200. In some embodiments, the top surfaces of the conductive structures 300 and the top surfaces of the conductive posts 206 are in contact with the bottommost redistribution conductive patterns (the first redistribution conductive patterns 604a). The top surfaces of the conductive structures 300 and the top surfaces of the conductive posts 206 may be partially of fully covered by the first redistribution conductive patterns 604a. Furthermore, the topmost redistribution conductive patterns may be referred to as the UBM patterns 606a and the connection pads 606b. It should be noted that the number of the dielectric layer and the number of the redistribution conductive patterns of the redistribution structure 600 depicted in FIG. 1H merely serve as exemplary illustrations, and the disclosure is not limited thereto. In some alternative embodiments, fewer or more dielectric layers and/or redistribution conductive patterns may be adapted based on circuit design.

As mentioned above, the top surface 500a' of the enhancement layer 500' is a smooth surface. In other words, the redistribution structure 600 may be formed on a flat surface. Since the redistribution structure 600 is formed on a flat surface, the problem of breakage of the redistribution conductive patterns in the redistribution structure 600 may be sufficiently alleviated. As such, finer pitch of the metallic traces in the redistribution structure 600 may be realized and the quality of the metallic traces in the redistribution structure 600 may be ensured.

Figure 1I:
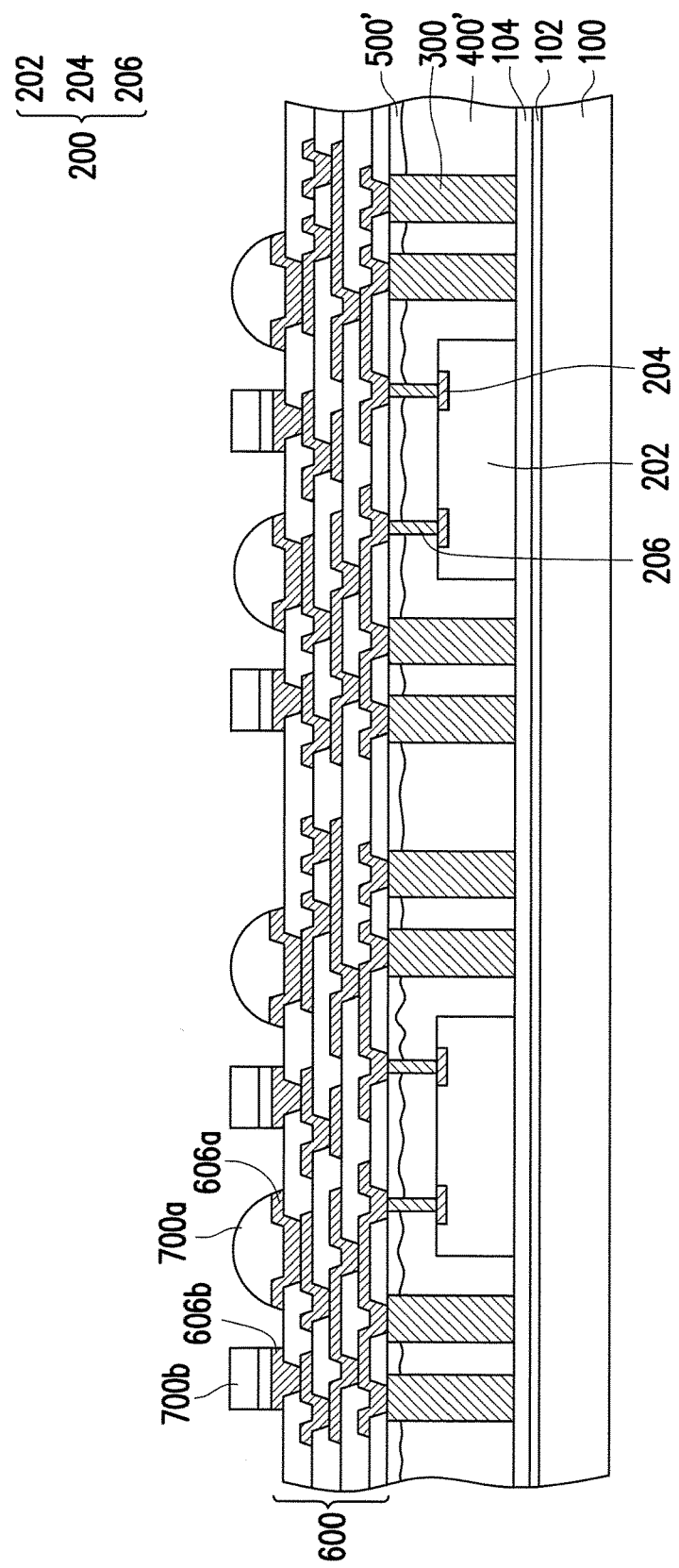

Referring to FIG. 1I, after the redistribution structure 600 is formed, a plurality of conductive terminals 700a is placed on the UBM patterns 606a and a plurality of passive components 700b is mounted on the connection pads 606b. In some embodiments, the conductive terminals 700a may be placed on the UBM patterns 606a through a ball placement process or other suitable processes. In some embodiments, the passive components 700b may be mounted on the connection pads 606b through a soldering process, a reflowing process, or other suitable processes.

Figure 1J:
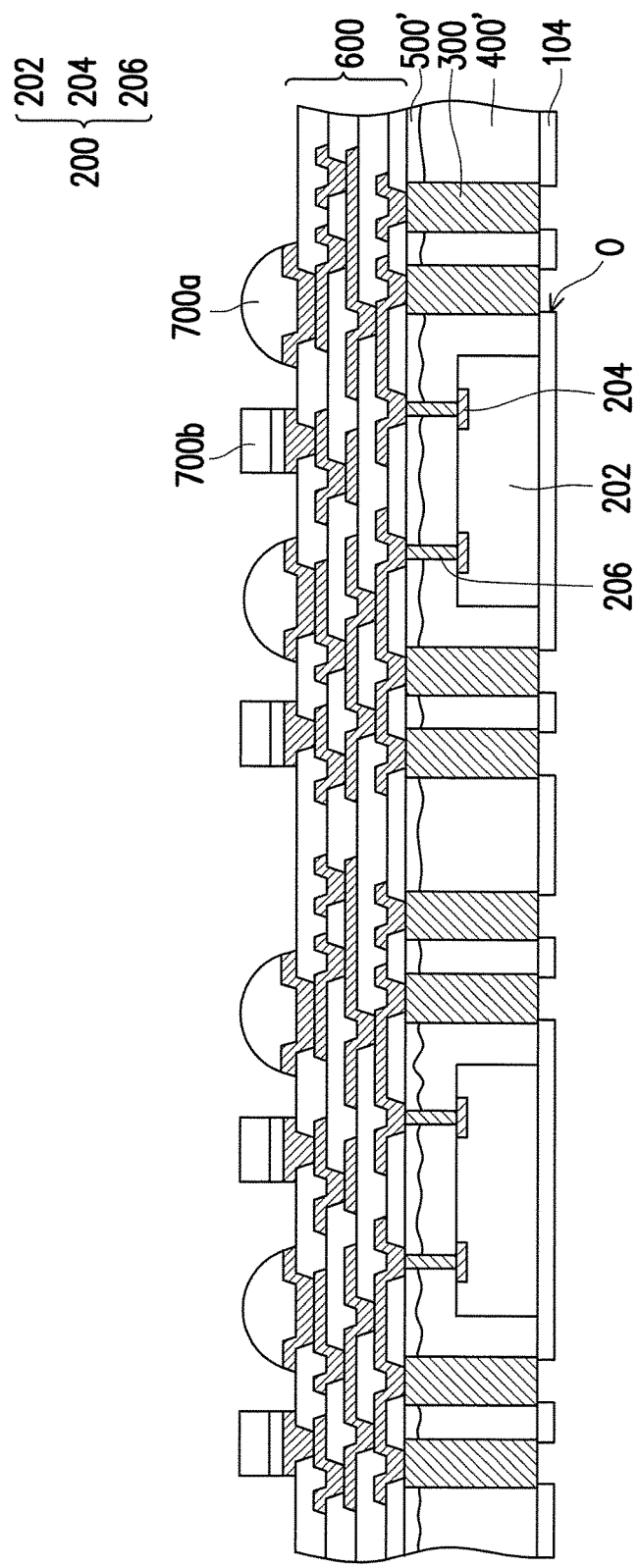

Referring to FIG. 1J, the dielectric layer 104 formed on the bottom surface of the encapsulant 400' is de-bonded from the de-bonding layer 102 such that the dielectric layer 104 is separated from the carrier 100. That is, the carrier 100 is removed. In some embodiments, the de-bonding layer 102 (e.g., the LTHC release layer) may be irradiated by an UV laser such that the dielectric layer 104 is peeled off from the carrier 100. As illustrated in FIG. 1J, the dielectric layer 104 is then patterned such that a plurality of contact openings O is formed to partially expose the conductive structures 300. In some embodiments, the contact openings O of the dielectric layer 104 are formed by a laser drilling process, a mechanical drilling process, or other suitable processes.

Figure 1K:
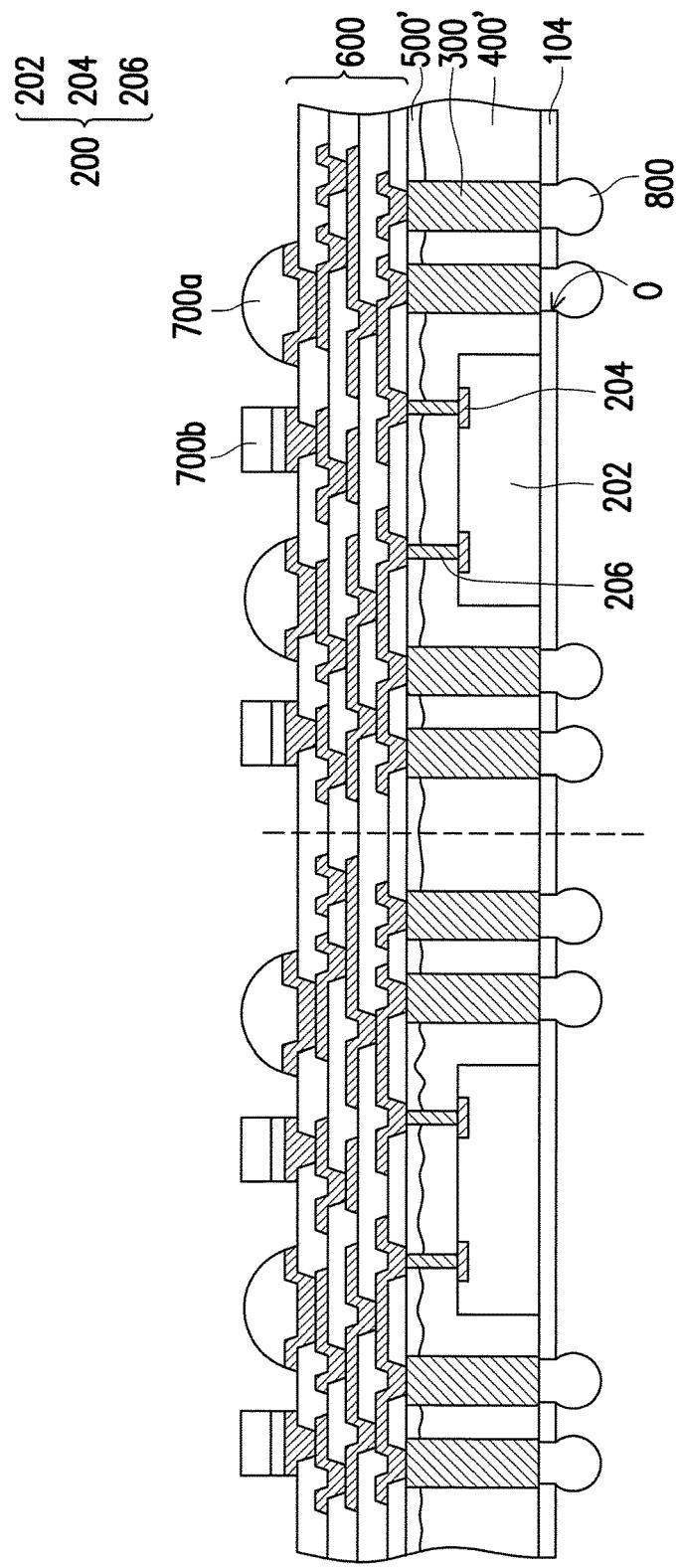
Figure 1L:
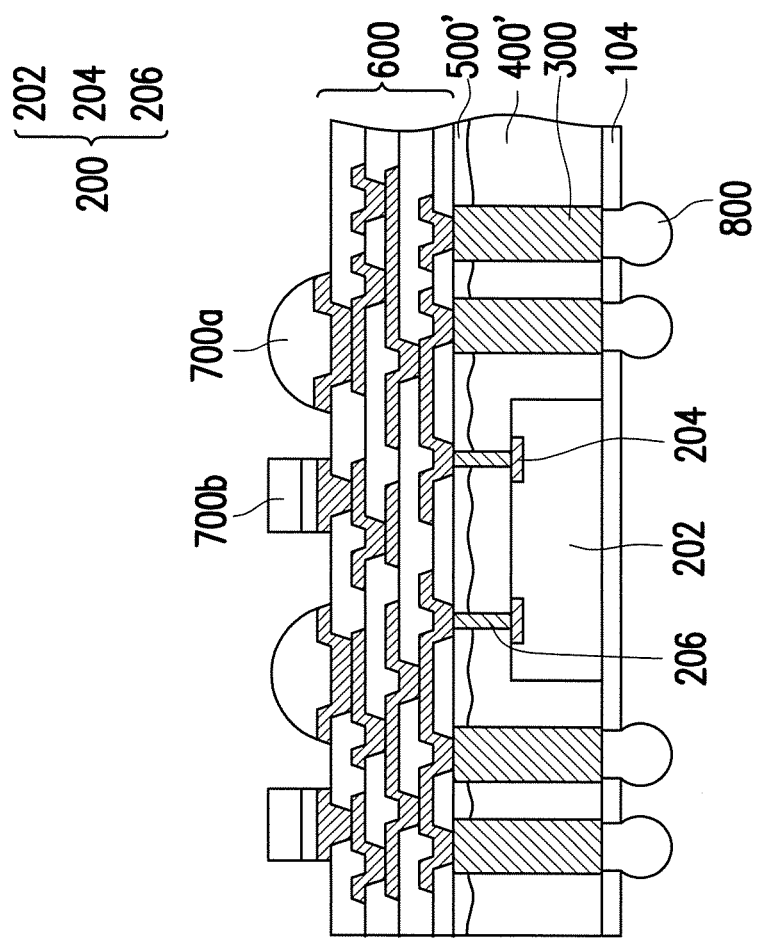

Referring to FIG. 1K and FIG. 1L, a plurality of conductive terminals 800 is placed in the contact openings O. The conductive terminals 800 are electrically connected to the conductive structures 300. Herein, formation of an integrated fan-out (InFO) package array is substantially completed. As illustrated in FIG. 1K and FIG. 1L, after the conductive terminals 800 are formed, the InFO package array is diced to form a plurality of InFO packages 10 having dual-side terminal design. In some embodiment, the dicing process or singulation process typically involves dicing with a rotating blade or a laser beam. In other words, the dicing or singulation process is, for example, a laser cutting process, a mechanical cutting process, or other suitable processes.

Figure 2A:
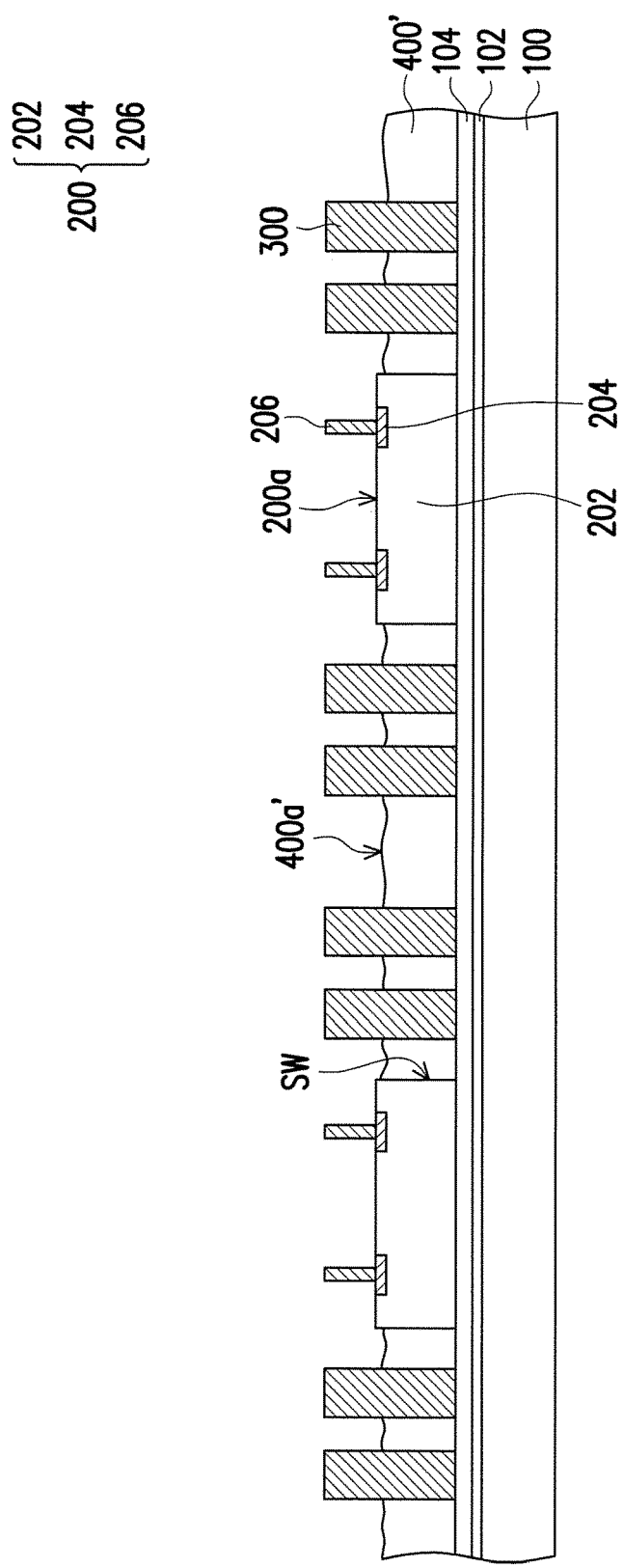
FIG. 2A is a schematic cross-sectional view illustrating an intermediate step of a manufacturing process of an InFO package in accordance with some alternative embodiments of the disclosure.
Figure 2B:
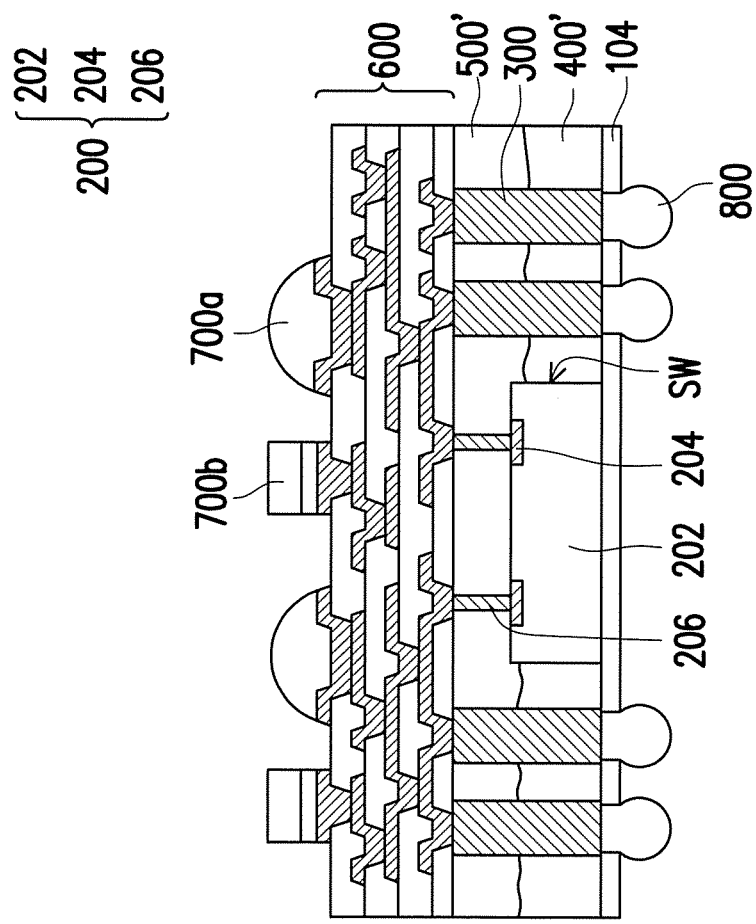
FIG. 2B is a schematic cross-sectional view illustrating an InFO package in accordance with some alternative embodiments of the disclosure.

FIG. 2A is a schematic cross-sectional view illustrating an intermediate step of a manufacturing process of an InFO package 20 in accordance with some alternative embodiments of the disclosure. FIG. 2B is a schematic cross-sectional view illustrating an InFO package 20 in accordance with some alternative embodiments of the disclosure. Referring to FIG. 2B, the manufacturing steps of InFO package 20 are similar to the steps illustrated in FIG. 1A to FIG. 1L except the step illustrated in FIG. 1E is replaced by the step illustrated in FIG. 2A. As illustrated in FIG. 2A, the portion of the encapsulant material 400 may be removed such that the top surface 400a' of the encapsulant 400' is lower than the active surfaces 200a of the dies 200. In other words, after the plasma etching process, the conductive posts 206, the active surfaces 200a, and a portion of sidewalls SW of the dies 200 are exposed by the encapsulant 400'. For example, as illustrated in FIG. 2B, the encapsulant 400' covers a portion of the sidewalls SW of the die 200 and a portion of sidewalls of the conductive structures 300. On the other hand, the enhancement layer 500' covers another portion of the sidewalls SW of the die 200, another portion of sidewalls of the conductive structures 300, the active surface 200a of the die 200, and sidewalls of the conductive posts 206. Since the level height of the top surface 400a' of the encapsulant 400' is not particularly limited, a high plasma etching precision is not required. As such, the process complexity may be reduced, thereby achieving an easier manufacturing process.

Figure 3A:
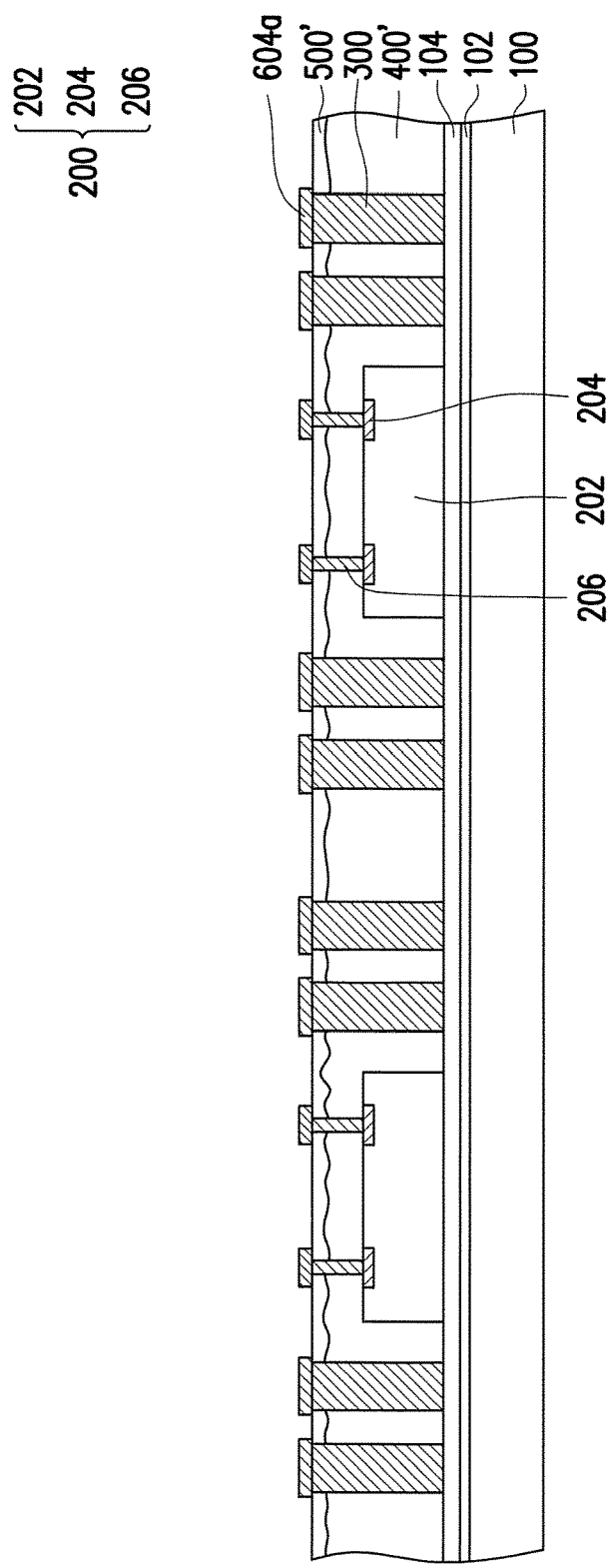
FIG. 3A to FIG. 3D are schematic cross-sectional views illustrating intermediate steps of a manufacturing process of an InFO package in accordance with some alternative embodiments of the disclosure.
Figure 3B:
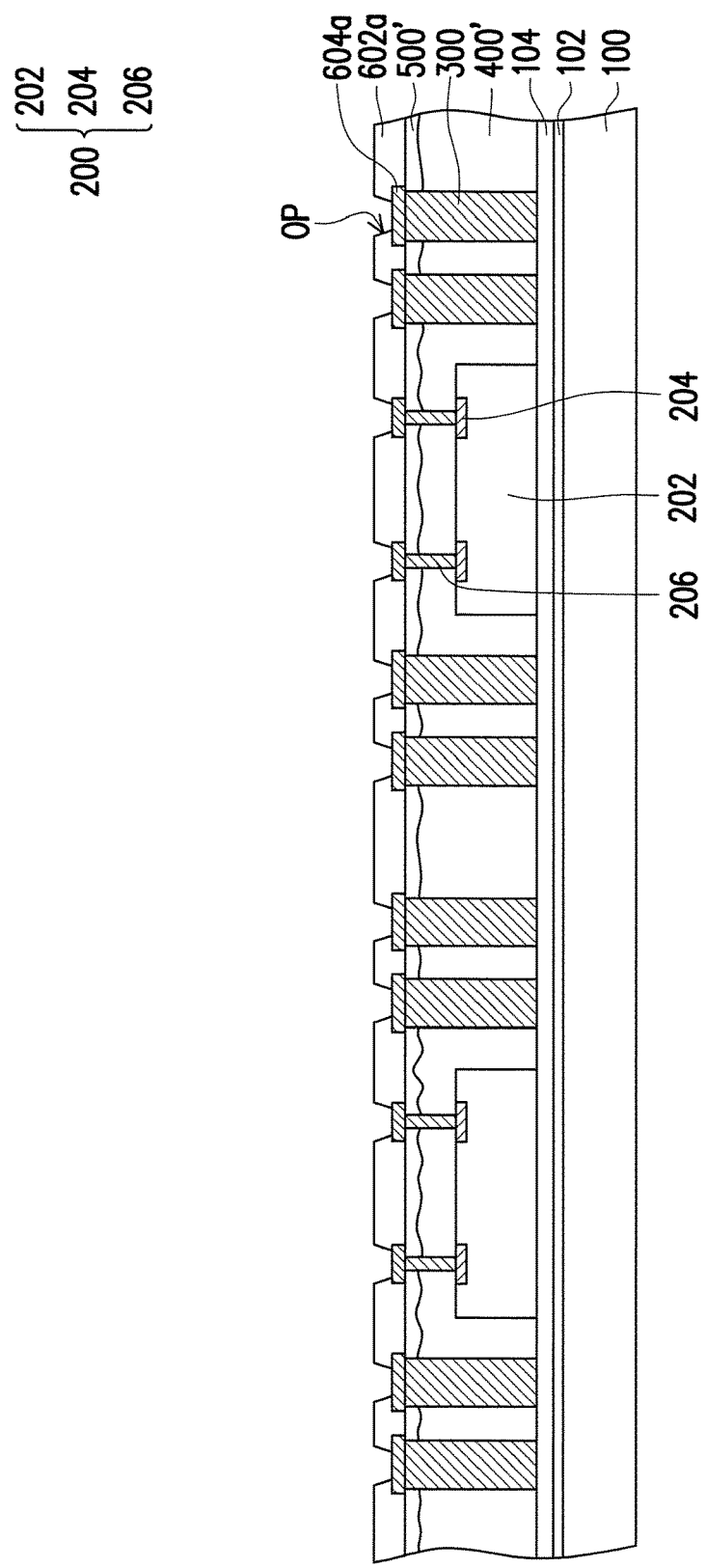

FIG. 3A to FIG. 3D are schematic cross-sectional views illustrating intermediate steps of a manufacturing process of an InFO package 30 in accordance with some alternative embodiments of the disclosure. FIG. 3E is a schematic cross-sectional view illustrating an InFO package 30 in accordance with some alternative embodiments of the disclosure. Referring to FIG. 3E, the manufacturing steps of InFO package 30 are similar to the steps illustrated in FIG. 1A to FIG. 1L except the steps illustrated in FIG. 1F to FIG. 1H are replaced by the steps illustrated in FIG. 3A to FIG. 3D. Referring to FIG. 3A and FIG. 3B, when the material of the enhancement layer 500' is the same as the material of the dielectric layer (for example, the first dielectric layer 602a in FIG. 3B) in the redistribution structure 600, the first redistribution conductive patterns 604a may be formed prior to the formation of the first dielectric layer 602a. As illustrated in FIG. 3A, the first redistribution conductive patterns 604a are formed over the enhancement layer 500', the conductive structures 300, and the conductive posts 206. The formation method and the material of the first redistribution conductive patterns 604a may be referred to the descriptions related to FIG. 1G presented above, so the detailed description thereof is omitted herein.

Referring to FIG. 3B, the first dielectric layer 602a is formed over the first redistribution conductive patterns 604a. The first dielectric layer 602a has a plurality of openings OP exposing the first redistribution conductive patterns 604a. The formation method and the material of the first dielectric layer 602a may be referred to the descriptions related to FIG. 1F presented above, so the detailed description thereof is omitted herein.

Figure 3C:
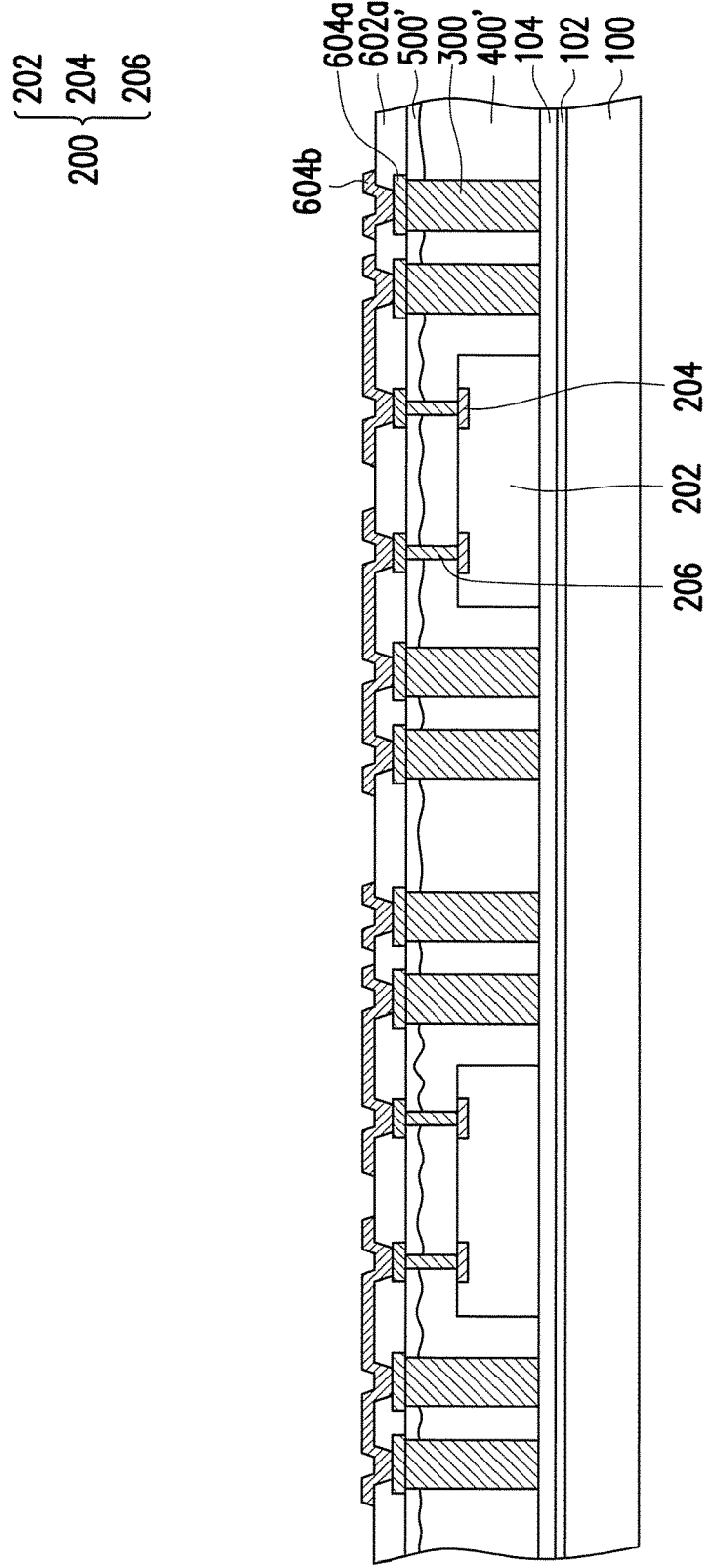

Referring to FIG. 3C, a plurality of second redistribution conductive patterns 604b is formed over the first dielectric layer 602a and extends into the openings OP of the first dielectric layer 602a to be in direct contact with the first redistribution conductive patterns 604a. The second redistribution conductive patterns 604b may be formed by similar manner as that of the first redistribution conductive patterns 604b, so the detailed description thereof is omitted herein.

Figure 3D:
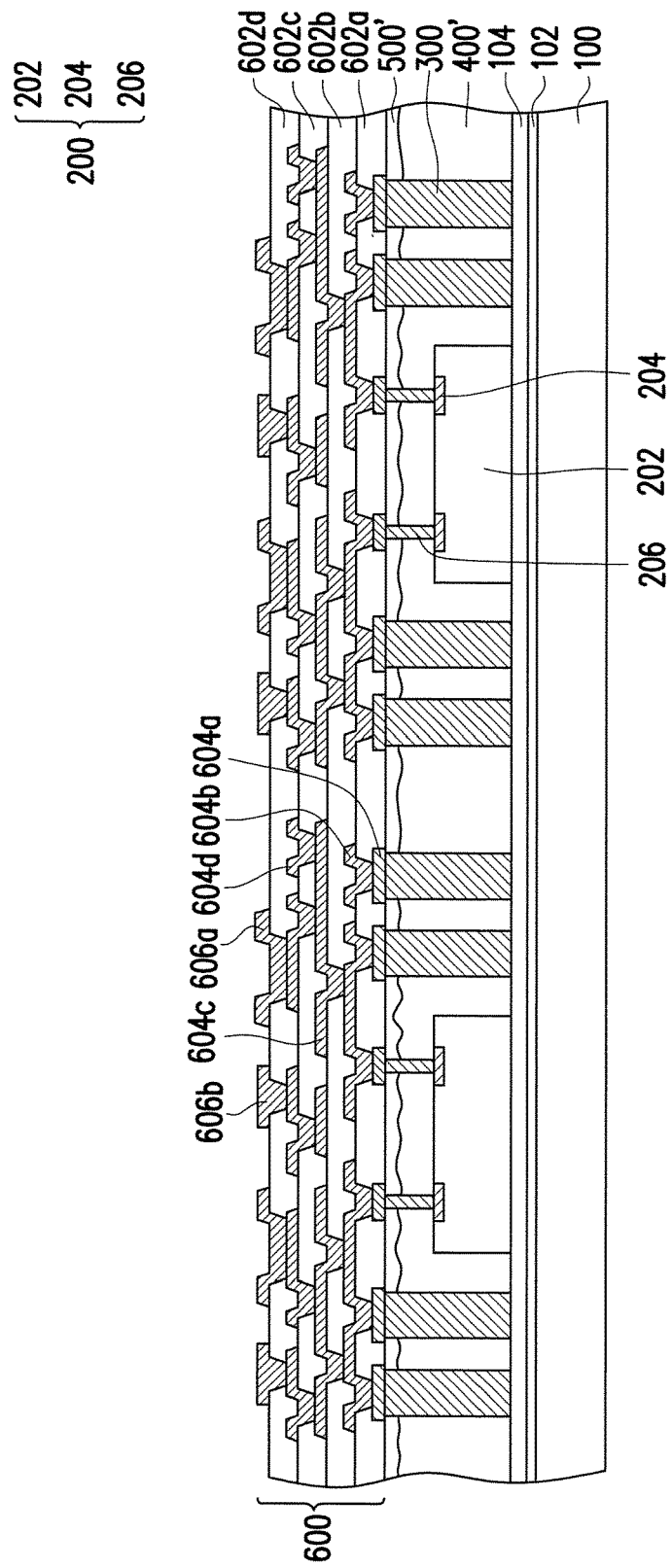
Figure 3E:
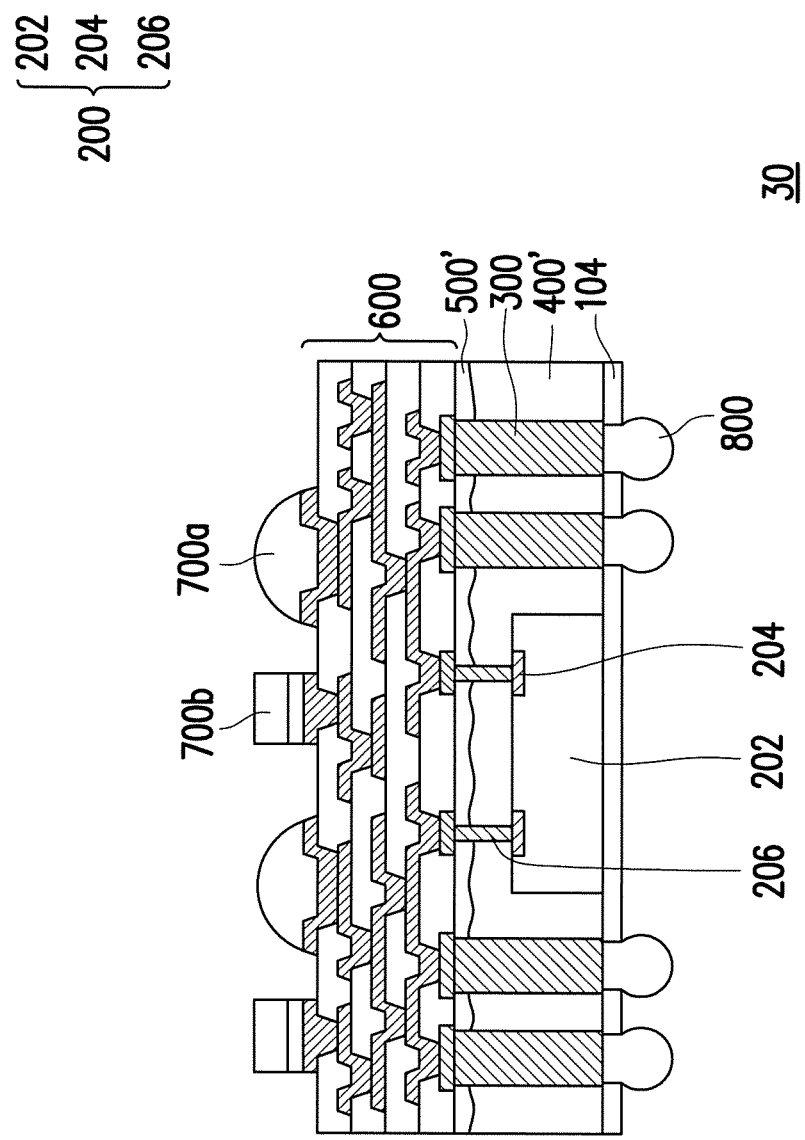
FIG. 3E is a schematic cross-sectional view illustrating an InFO package in accordance with some alternative embodiments of the disclosure.

Referring to FIG. 3D, the steps similar to the steps illustrated in FIG. 3B to FIG. 3C may be repeated to form a second dielectric layer 602b, a third dielectric layer 602c, a fourth dielectric layer 602d, a plurality of third redistribution conductive patterns 604c, a plurality of fourth redistribution conductive patterns 604d, a plurality of UBM patterns 606a, and a plurality of connection pads 606b. For example, the second dielectric layer 602b may be formed over the first dielectric layer 602a and the second redistribution conductive patterns 604b. Similar to the first dielectric layer 602a, the second dielectric layer 602b also has a plurality of openings exposing the second redistribution conductive patterns 604b. Subsequently, the third redistribution conductive patterns 604c is formed over the second dielectric layer 602b and extends into the openings of the second dielectric layer 602b to be in direct contact with the second redistribution conductive patterns 604b. The third dielectric layer 602c, the fourth dielectric layer 602d, the fourth redistribution conductive patterns 604d, the UBM patterns 606a, and the connection pads 606b may be formed by the similar manner, so the detailed descriptions thereof are omitted herein. It should be noted that the number of the dielectric layer and the number of the redistribution conductive patterns of the redistribution structure 600 depicted in FIG. 3D merely serve as an exemplary illustrations, and the disclosure is not limited thereto. In some alternative embodiments, fewer or more dielectric layers and/or redistribution conductive patterns may be adapted based on circuit design.

Figure 4:
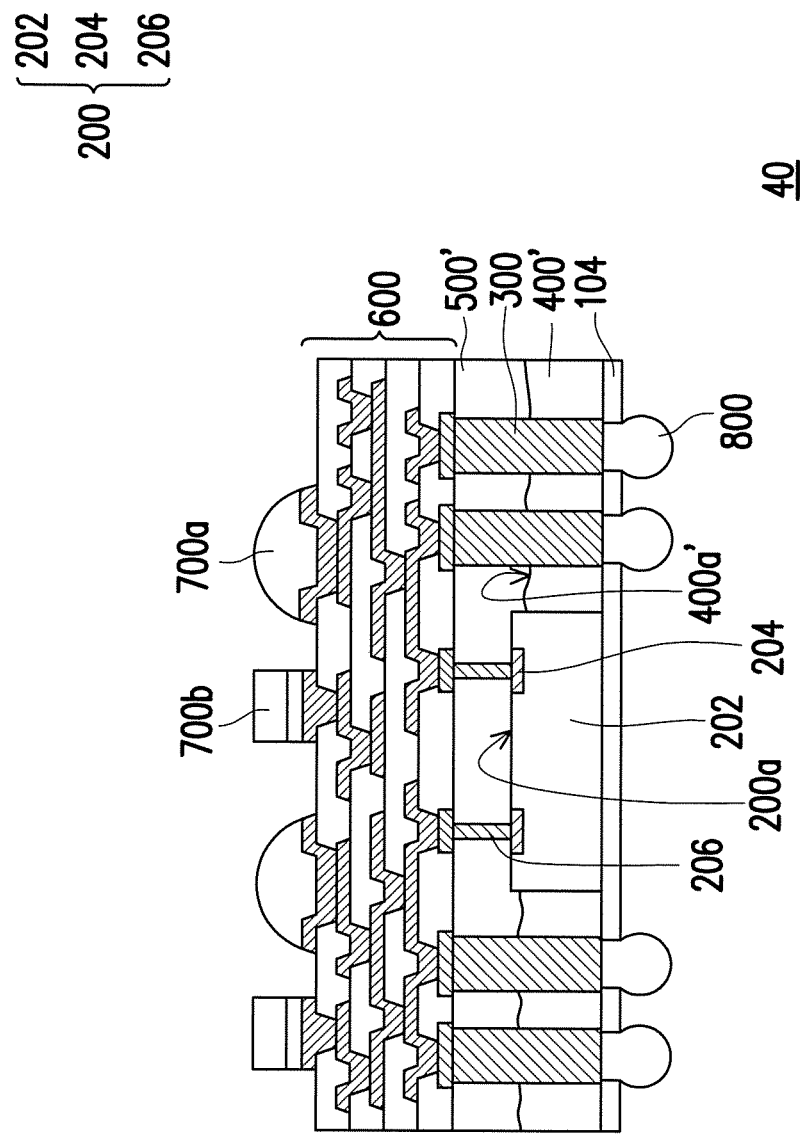
FIG. 4 is a schematic cross-sectional view illustrating an InFO package in accordance with some alternative embodiments of the disclosure.

FIG. 4 is a schematic cross-sectional view illustrating an InFO package 40 in accordance with some alternative embodiments of the disclosure. Referring to FIG. 4, the manufacturing steps of InFO package 40 are similar to the steps illustrated in FIG. 1A to FIG. 1L except the step illustrated in FIG. 1E is replaced by the step illustrated in FIG. 2A and the steps illustrated in FIG. 1F to FIG. 1H are replaced by the steps illustrated in FIG. 3A to FIG. 3D. Therefore, the detailed descriptions of the manufacturing steps of the InFO package 40 are omitted herein. As illustrated in FIG. 4, the top surface 400a' of the encapsulant 400' is lower than the active surface 200a of the die 200.

Figure 5:
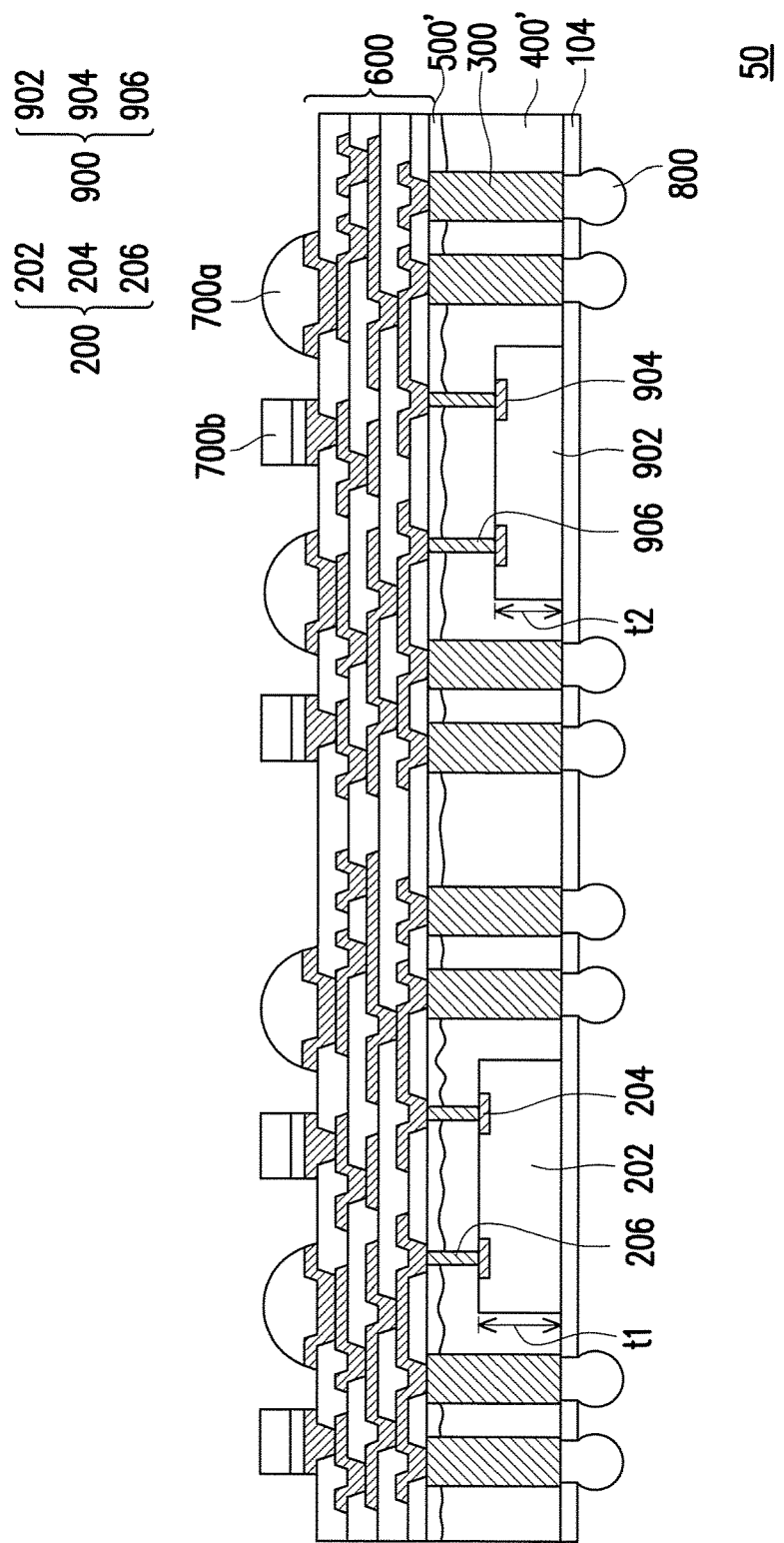
FIG. 5 is a schematic cross-sectional view illustrating an InFO package in accordance with some alternative embodiments of the disclosure.

FIG. 5 is a schematic cross-sectional view illustrating an InFO package 50 in accordance with some alternative embodiments of the disclosure. Referring to FIG. 5, the InFO package 50 is similar to the InFO package 10 illustrated in FIG. 1L except InFO package 50 further includes an additional die 900. Similar to the die 200, the additional die 900 also includes a semiconductor substrate 902, a plurality of conductive pads 904, and a plurality of conductive posts 906. The detailed descriptions of the semiconductor substrate 902, the conductive pads 904, and the conductive posts 906 may be respectively referred to the descriptions related to the semiconductor substrate 202, the conductive pads 204, and the conductive posts 206, so the detailed descriptions thereof are omitted herein. In some embodiments, a thickness t1 of the die 200 may be different from a thickness t2 of the additional die 900. For example, as illustrated in FIG. 5, the thickness t1 of the die 200 is larger than the thickness t2 of the additional die 900. In some embodiments, the die 200 and the additional die 900 may be different dies performing different logic functions. However, it construes no limitation in the disclosure. In some alternative embodiments, the thickness t1 of the die 200 may be smaller than or equal to the thickness t2 of the additional die 900. In addition, in some alternative embodiments, the die 200 and the additional die 900 may be identical dies performing the same logic function.

It should be noted that although not illustrated, the InFO package 20 in FIG. 2B, the InFO package 30 in FIG. 3E, and the InFo package 40 in FIG. 4 may also include an additional die similar to the additional die 900 in FIG. 5.

In accordance with some embodiments of the disclosure, and integrated fan-out (InFO) package includes at least one die, a plurality of conductive structures, an encapsulant, an enhancement layer, and a redistribution structure. The at least one die has an active surface and includes a plurality of conductive posts on the active surface. The conductive structures surround the at least one die. The encapsulant partially encapsulates the at least one die. The enhancement layer is over the encapsulant. A top surface of the enhancement layer is substantially coplanar with top surfaces of the conductive posts and the conductive structures. A material of the enhancement layer is different from a material of the encapsulant. A roughness (Ra) of an interface between the encapsulant and the enhancement layer is larger than a roughness of the top surface of the enhancement layer. A redistribution structure is over the enhancement layer and is electrically connected to the conductive structures and the at least one die.

In accordance with some alternative embodiments of the disclosure, a method of manufacturing an integrated fan-out (InFO) package includes at least the following steps. A plurality of dies and a plurality of conductive structures are provided on a carrier. Each of the dies has an active surface and includes a plurality of conductive posts on the active surface. The active surface is exposed. The dies and the conductive structures are encapsulated with an encapsulant material. A portion of the encapsulant material is removed to form an encapsulant. The encapsulant exposes at least a portion of sidewalls of the conductive structures and at least a portion of sidewalls of the conductive posts. An enhancement layer is formed over the encapsulant. The enhancement layer seals the at least a portion of sidewalls of the conductive posts exposed by the encapsulant and the at least a portion of sidewalls of the conductive structures exposed by the encapsulant. A top surface of the enhancement layer is substantially coplanar with top surfaces of the conductive posts and the conductive structures. A redistribution structure is formed over the enhancement layer.

In accordance with some alternative embodiments of the disclosure, a method of manufacturing an integrated fan-out (InFO) package includes at least the following steps. A plurality of dies and a plurality of conductive structures are provided on a carrier. Each of the dies has an active surface and includes a plurality of conductive posts on the active surface. The active surface is exposed. The dies and the conductive structures are encapsulated with an encapsulant material. A portion of the encapsulant material is removed to form an encapsulant. The encapsulant covers a portion of sidewalls of the conductive structures and a portion of sidewalls of the conductive posts. An enhancement layer is formed over the encapsulant. The enhancement layer covers another portion of sidewalls of the conductive posts and another portion of sidewalls of the conductive structures. A ratio of a coverage of the sidewalls of the conductive posts by the encapsulant to a coverage of the sidewalls of the conductive posts by the enhancement layer ranges between 50%:50% and 80%:20%. A redistribution structure is formed over the enhancement layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing an integrated fan-out (InFO) package, comprising:

providing a plurality of dies and a plurality of conductive structures on a carrier, wherein each of the plurality of dies has an active surface and comprises a plurality of conductive posts on the active surface, and the active surface is exposed;

encapsulating the plurality of dies and the plurality of conductive structures with an encapsulant material;

removing a portion of the encapsulant material to form an encapsulant, wherein the encapsulant exposes at least a portion of sidewalls of the plurality of conductive structures and at least a portion of sidewalls of the plurality of conductive posts;

forming an enhancement layer over the encapsulant, wherein the enhancement layer seals the at least a portion of sidewalls of the plurality of conductive posts exposed by the encapsulant and the at least a portion of sidewalls of the plurality of conductive structures exposed by the encapsulant, and a top surface of the enhancement layer is substantially coplanar with top surfaces of the plurality of conductive posts and the plurality of conductive structures; and forming a redistribution structure over the enhancement layer.

2. The method according to claim 1, wherein the step of removing the portion of the encapsulant material comprises performing a plasma etching process to remove the portion of the encapsulant material such that a plurality of microstructures are formed on the encapsulant.

3. The method according to claim 2, wherein the step of removing the portion of the encapsulant material further comprises performing the plasma etching process to remove the portion of the encapsulant material such that the active surface and a portion of sidewalls of the plurality of dies are exposed.

4. The method according to claim 1, wherein the step of forming the redistribution structure comprises:

forming a first dielectric layer over the enhancement layer, the plurality of conductive structures, and the plurality of conductive posts, wherein the first dielectric layer has a plurality of openings exposing the plurality of conductive structures and the plurality of conductive posts;

forming a plurality of first redistribution conductive patterns over the first dielectric layer and within the plurality of openings of the first dielectric layer;

forming a second dielectric layer over the first dielectric layer and the plurality of first redistribution conductive patterns, wherein the second dielectric layer has a plurality of openings exposing the plurality of first redistribution conductive patterns; and forming a plurality of under-ball metallurgy (UBM) patterns over the second dielectric layer, wherein the plurality of UBM patterns are electrically connected to the plurality of conductive structures and the plurality of conductive posts.

5. The method according to claim 1, wherein the step of forming the redistribution structure comprises:

forming a plurality of first redistribution conductive patterns over the plurality of conductive structures and the plurality of conductive posts;

forming a first dielectric layer over the plurality of first redistribution conductive patterns, wherein the first dielectric layer has a plurality of openings exposing the plurality of first redistribution conductive patterns;

forming a plurality of second redistribution conductive patterns over the first dielectric layer and within the plurality of openings of the first dielectric layer;

forming a second dielectric layer over the first dielectric layer and the plurality of second redistribution conductive patterns, wherein the second dielectric layer has a plurality of openings exposing the plurality of second redistribution conductive patterns; and forming a plurality of under-ball metallurgy (UBM) patterns over the second dielectric layer, wherein the plurality of UBM patterns are electrically connected to the plurality of conductive structures and the plurality of conductive posts.

6. The method according to claim 5, wherein a material of the enhancement layer is the same as a material of the first dielectric layer.

7. The method according to claim 1, further comprising:
forming a plurality of conductive terminals over the redistribution structure.

8. A method of manufacturing an integrated fan-out (InFO) package, comprising:

providing a plurality of dies and a plurality of conductive structures on a carrier, wherein each of the plurality of dies has an active surface and comprises a plurality of conductive posts on the active surface, and the active surface is exposed;

encapsulating the plurality of dies and the plurality of conductive structures with an encapsulant material;

removing a portion of the encapsulant material to form an encapsulant, wherein the encapsulant covers a portion of sidewalls of the plurality of conductive structures and a portion of sidewalls of the plurality of conductive posts;

forming an enhancement layer over the encapsulant, wherein the enhancement layer covers another portion of sidewalls of the plurality of conductive posts and another portion of sidewalls of the plurality of conductive structures, and a ratio of a coverage of the sidewalls of the plurality of conductive posts by the encapsulant to a coverage of the sidewalls of the plurality of conductive posts by the enhancement layer ranges between 50%:50% and 80%:20%;

forming a redistribution structure over the enhancement layer.

9. The method according to claim 8, wherein the step of removing the portion of the encapsulant material comprises performing a plasma etching process to remove the portion of the encapsulant material such that a plurality of microstructures are formed on the encapsulant.

10. The method according to claim 8, wherein the step of forming the redistribution structure comprises:

forming a first dielectric layer over the enhancement layer, the plurality of conductive structures, and the plurality of conductive posts, wherein the first dielectric layer has a plurality of openings exposing the plurality of conductive structures and the plurality of conductive posts;

forming a plurality of first redistribution conductive patterns over the first dielectric layer and within the plurality of openings of the first dielectric layer;

forming a second dielectric layer over the first dielectric layer and the plurality of first redistribution conductive patterns, wherein the second dielectric layer has a plurality of openings exposing the plurality of first redistribution conductive patterns; and forming a plurality of under-ball metallurgy (UBM) patterns over the second dielectric layer, wherein the plurality of UBM patterns are electrically connected to the plurality of conductive structures and the plurality of conductive posts.

11. The method according to claim 8, wherein the step of forming the redistribution structure comprises:
- forming a plurality of first redistribution conductive patterns over the plurality of conductive structures and the plurality of conductive posts;
- forming a first dielectric layer over the plurality of first redistribution conductive patterns, wherein the first dielectric layer has a plurality of openings exposing the plurality of first redistribution conductive patterns;
- forming a plurality of second redistribution conductive patterns over the first dielectric layer and within the plurality of openings of the first dielectric layer;
- forming a second dielectric layer over the first dielectric layer and the plurality of second redistribution conductive patterns, wherein the second dielectric layer has a plurality of openings exposing the plurality of second redistribution conductive patterns; and
- forming a plurality of under-ball metallurgy (UBM) patterns over the second dielectric layer, wherein the plurality of UBM patterns are electrically connected to the plurality of conductive structures and the plurality of conductive posts.

12. The method according to claim 11, wherein a material of the enhancement layer is the same as a material of the first dielectric layer.

13. The method according to claim 8, further comprising:
- forming a plurality of conductive terminals over the redistribution structure.

* * * * *